United States Patent
Takasawa et al.

(10) Patent No.: US 7,242,246 B2
(45) Date of Patent: Jul. 10, 2007

(54) AMPLITUDE DETECTING METHOD, AGC CIRCUIT GAIN CONTROLLING METHOD, AMPLITUDE DETECTING APPARATUS AND AGC AMPLIFIER CIRCUIT

(75) Inventors: Yoshitsugu Takasawa, Takatsuki (JP); Iwao Kojima, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 129 days.

(21) Appl. No.: 11/103,586

(22) Filed: Apr. 12, 2005

(65) Prior Publication Data

US 2005/0231285 A1    Oct. 20, 2005

(30) Foreign Application Priority Data

Apr. 16, 2004    (JP)    ............................ 2004-121010

(51) Int. Cl.
*H03G 3/20*    (2006.01)
(52) U.S. Cl. ...................................................... 330/140
(58) Field of Classification Search ................. 330/140
See application file for complete search history.

(56) References Cited

U.S. PATENT DOCUMENTS

| 5,051,614 A | * | 9/1991 | Ohta ............................ 327/254 |
| 5,781,588 A | * | 7/1998 | Abe et al. .................... 375/334 |
| 6,459,889 B1 | * | 10/2002 | Ruelke ........................ 455/296 |

FOREIGN PATENT DOCUMENTS

JP    08172330    7/1996

* cited by examiner

*Primary Examiner*—Benny Lee
*Assistant Examiner*—Alan Wong
(74) *Attorney, Agent, or Firm*—Stevens, Davis, Miller & Mosher, LLP

(57) ABSTRACT

In an amplitude detecting circuit, a phase shifter, into which an alternating current signal that is outputted from an AGC circuit is inputted, outputs first and second alternating current signals between which there is a phase difference. In addition, full wave rectifying is carried out in a first full wave rectifier on the first alternating current signal that is outputted from the phase shifter and in the same manner full wave rectifying is carried out in a second full wave rectifier on the second alternating current signal. Furthermore, in an averaging circuit, output signals of the first and second full wave rectifiers are averaged so as to generate an amplitude detection signal.

13 Claims, 9 Drawing Sheets

AMPLITUDE DETECTING METHOD, AGC CIRCUIT GAIN CONTROLLING METHOD, AMPLITUDE DETECTING APPARATUS AND AGC AMPLIFIER CIRCUIT

BACKGROUND OF THE INVENTION

1. Field of the Invention

The present invention relates to an amplitude detecting method for detecting the amplitude of an alternating current signal, and an AGC circuit gain controlling method for controlling the gain of an AGC circuit by using the amplitude detecting method.

In addition, the present invention relates to an amplitude detecting apparatus for detecting the amplitude of an alternating current signal, and an AGC amplifier circuit which includes an amplitude detecting apparatus as a component, and which controls the gain of an AGC circuit.

2. Prior Art

An AGC amplifier circuit according to the prior art has a function of outputting an alternating current signal having a constant amplitude in response to fluctuations in the amplitude of an inputted transmission signal (alternating current signal). In order to implement this function, the AGC amplifier circuit has an AGC circuit and an amplitude detecting circuit for detecting the amplitude of an output signal of the AGC circuit, and is provided with an automatic gain controlling (AGC) mechanism where an amplitude detection signal of the amplitude detecting circuit is fed back to the AGC circuit.

In the above described configuration, when the DC voltage, which is the amplitude detection signal of the amplitude detecting circuit, is not constant, but rather fluctuates, the gain of the AGC circuit also fluctuates, and the waveform of the transmission signal that is outputted from the AGC circuit is distorted, because the time constant of the feedback loop is significantly small.

Next, FIG. 8 shows the configuration of an AGC amplifier circuit according to the prior art using a smoothing condenser. This AGC amplifier circuit is formed of an input terminal 1, an AGC circuit 2, an output terminal 3 and an amplitude detecting circuit 10.

AGC circuit 2 amplifies a transmission signal a that has been inputted into input terminal 1 by the gain in accordance with the gain control signal and outputs the resulting signal, and thereby, the amplitude of output signal b is made constant, irrespectively of the fluctuation in the amplitude of transmission signal a.

Amplitude detecting circuit 10 that is used to detect the amplitude of output signal b of AGC circuit 2 is formed of an input terminal 4 of the amplitude detecting circuit, an output terminal 5 of the amplitude detecting circuit, a full wave rectifier 11 and a smoothing condenser 12.

Thus, in this configuration, full wave rectifying is carried out on output signal b of AGC circuit 2, and in addition, the signal is smoothed, and thereby, an amplitude detection signal c1 which corresponds to the amplitude of output signal b is outputted. This amplification detection signal c1 is supplied to AGC circuit 2 as a gain control signal.

FIG. 9 shows operation waves in each portion of the AGC amplifier circuit of FIG. 8. FIG. 9 shows the waveform of transmission signal a, the waveform of output signal b of AGC circuit 2, the waveform of amplitude detection signal c1 of amplitude detecting circuit 10 and a change in gain G of AGC circuit 2, respectively. Here, in the waveform of amplitude detection signal c1, the broken line indicates a case where there is no smoothing condenser, and the solid line indicates a case where there is a smoothing condenser.

When smoothing condenser 12 is not utilized, the time constant of the feedback loop formed of AGC circuit 2 and amplitude detecting circuit 10 is small. Therefore, the wavelength of amplitude detection signal c1 becomes the same as the waveform of the output of the full wave rectifier, as shown by the broken line. As a result of this, gain G of AGC circuit 1 fluctuates a great deal, and thereby, the waveform of transmission signal b that is outputted from AGC circuit 2 is distorted.

In contrast to this, when smoothing condenser 12 is used, the time constant of the above described feedback loop increases, and the fluctuation in the waveform of amplitude detection signal c1 decreases, as shown by the solid line. As a result of this, the fluctuation in gain G of AGC circuit 1 is reduced, and thereby, the distortion in the waveform of transmission signal b that is outputted from AGC circuit 1 is reduced.

Patent Document 1: Japanese Unexamined Patent Publication H08 (1996)-172330

In the configuration of FIG. 8 according to the prior art, smoothing condenser 12 is used in order to improve the waveform so as to reduce distortion, and therefore, a problem arises, where the time constant of the feedback loop is increased, and the speed of response of the AGC amplifier is lowered.

SUMMARY OF THE INVENTION

An object of the present invention is to provide an amplitude detecting method and an amplitude detecting circuit where the fluctuation in the amplitude detection signal caused by a periodic change in an alternating current signal of the object of amplitude detection can be suppressed.

Another object of the present invention is to provide an amplitude detecting method and an amplitude detecting circuit where the speed of response is fast.

Still another object of the present invention is to provide an AGC circuit gain controlling method and an AGC amplifier circuit where distortion in the output signal of the AGC circuit can be reduced.

Yet another object of the present invention is to provide an AGC amplifier circuit where the speed response is fast.

In order to achieve the above described objects, an amplitude detecting method according to the first invention is a method for gaining an amplitude detection signal by generating a number of alternating current signals between which there are phase differences on the basis of the alternating current signal of the object of amplitude detection, and by carrying out the same waveform processes on the plurality of alternating current signals so as to average the alternating current signals.

According to this method, the DC voltage of the amplitude detection signal can be made nearly constant without requiring a means for increasing the time constant, such as a smoothing condenser. As a result of this, the fluctuation in the amplitude detection signal caused by a periodic change in the alternating current signal of the object of amplitude detection can be suppressed. In addition, the speed of response for amplitude detection can be increased, as use of a smoothing condenser or the like is unnecessary.

In the amplitude detecting method according to the above described first invention, for example, a full wave rectifying process may be included as a waveform process. In addition, in the amplitude detecting method according to the above described first invention, a squaring process may be included as the waveform process. In addition, in the amplitude detecting method according to the above described first invention, a full wave rectifying process and a squaring process may both be included as the waveform process.

An AGC circuit gain controlling method according to the second invention is a method for gaining an amplitude detection signal by generating a number of alternating current signals between which there are phase differences on the basis of the alternating current signal that is outputted from an AGC circuit, and by carrying out the same waveform processes on the number of alternating current signals, so as to average the alternating current signals, and for supplying the amplitude detection signal to the AGC circuit as a gain control signal.

According to this method, the DC voltage of the amplitude detection signal can be made nearly constant without requiring a means for increasing the time constant, such as a smoothing condenser. As a result of this, the fluctuation in the amplitude detection signal caused by a periodic change in the alternating current signal of the object of amplitude detection can be suppressed, and distortion in the output signal of the AGC circuit can be reduced. In addition, the speed of response for amplitude detection can be increased, as use of a smoothing condenser or the like is unnecessary, and accordingly, the speed of response for the gain control operation of the AGC circuit can be increased.

In the AGC circuit gain controlling method according to the second invention, a full wave rectifying process, for example, may be included as a waveform process. In addition, in the AGC circuit gain controlling method according to the second invention, a squaring process may be included as the waveform process. In addition, in the amplitude detecting method according to the second invention, a full wave rectifying process and a squaring process may both be included as the waveform process.

An amplitude detecting circuit according to the third invention is provided with a phase shifter into which the alternating current signal of the object of amplitude detection is inputted, and which outputs a number of alternating current signals between which there are phase differences, a number of full wave rectifiers for respectively carrying out full wave rectifying on the number of alternating current signals which are outputted from the phase shifter, and an averaging circuit for averaging output signals of the number of full wave rectifiers so as to generate an amplitude detection signal.

In this configuration, the DC voltage of the amplitude detection signal can be made nearly constant without requiring a means for increasing the time constant, such as a smoothing condenser. As a result of this, the fluctuation in the amplitude detection signal caused by a periodic change in the alternating current signal of the object of amplitude detection can be suppressed. In addition, the speed of response for amplitude detection can be increased, as use of a smoothing condenser or the like is unnecessary.

In the amplitude detection circuit according to the above described third invention, it is preferable for the phase difference $\phi$ between the first and second alternating current signals to have a value in the range of $45° < \phi < 135°$, in the case where the number of alternating current signals consist of the first and second alternating current signals.

The amplitude detecting circuit according to the fourth invention is provided with a shifter into which the alternating current signal of the object of amplitude detection is inputted, and which outputs first and second alternating current signals between which there is a shift difference, and a squaring and averaging circuit for squaring and averaging the first and second alternating current signals that are outputted from the shifter so as to generate and amplitude detection signal.

In this configuration, the DC voltage of the amplitude detection signal can be made nearly constant without requiring a means for increasing the time constant, such as a smoothing condenser. As a result of this, the fluctuation in the amplitude detection signal caused by a periodic change in the alternating current signal of the object of amplitude detection can be suppressed. In addition, the speed of response for amplitude detection can be increased, as use of a smoothing condenser or the like is unnecessary.

In the amplitude detecting circuit according to the above described fourth invention, it is preferable for the phase difference between the first and second alternating current signals to be 90°.

In such a configuration, the fluctuation in the amplitude detection signal caused by a periodic change in the alternating current signals can theoretically be nullified.

In addition, in the amplitude detecting circuit according to the above described fourth invention, a first full wave rectifier for carrying out full wave rectifying on the first alternating current signal that is outputted from the phase shifter so as to input the resulting signal into the squaring and averaging circuit, and a second full wave rectifier for carrying out full wave rectifying on the second alternating current signal that is outputted from the phase shifter so as to input the resulting signal into the squaring and averaging circuit may be provided between the phase shifter and the squaring and averaging circuit.

An AGC amplifier circuit according to the fifth invention is provided with an AGC circuit into which an alternating current input signal is inputted, and which amplifies the alternating current input signal by the gain in accordance with a gain control signal so as to output the resulting signal, an amplitude detecting circuit for generating an amplitude detection signal that corresponds to the amplitude of an alternating current signal that is outputted from the AGC circuit so as to supply the amplitude detection signal to the AGC circuit as a gain control signal, wherein the amplitude detecting circuit is provided with a shifter into which an alternating current signal that is outputted from the AGC circuit is inputted, and which outputs a number of alternating current signals between which there are phase differences, a number of full wave rectifiers for respectively carrying out full wave rectifying on the number of alternating current signals that are outputted from the phase shifter, and an averaging circuit for averaging output signals of the number of full wave rectifiers so as to generate the amplification detection signal.

In this configuration, the DC voltage of the amplitude detection signal can be made nearly constant without requiring a means for increasing the time constant, such as a smoothing condenser. As a result of this, the fluctuation in the amplitude detection signal caused by a periodic change in the alternating current signal of the object of amplitude detection can be suppressed, and distortion in the output signal of the AGC circuit can be reduced. In addition, the speed of response for amplitude detection can be increased, as use of a smoothing condenser or the like is unnecessary, and accordingly, the speed of response for the gain control operation of the AGC circuit can be increased.

In the AGC amplifier circuit according to the fifth invention, it is preferable for the phase difference $\phi$ between the first and second alternating current signals to have a value in the range of 45°<φ<135°, in the case where the number of alternating current signals consist of the first and second alternating current signals.

An AGC amplifier circuit according to the sixth invention is provided with an AGC circuit into which an alternating current input signal is inputted, and which amplifies the alternating current input signal by the gain in accordance with a gain control signal so as to output the resulting signal, an amplitude detecting circuit for generating an amplitude detection signal that corresponds to the amplitude of an alternating current signal that is outputted from the AGC circuit so as to supply the amplitude detection signal to the AGC circuit as a gain control signal, wherein the amplitude detecting circuit is provided with a shifter into which an alternating current signal that is outputted from the AGC circuit is inputted, and which outputs first and second alternating current signals between which there is a phase difference, a squaring and averaging circuit for squaring and averaging the first and second alternating current signals that are outputted from the phase shifter so as to generate an amplitude detection signal.

In this configuration, the same working effects as those of the fifth invention are gained.

In the AGC amplifier circuit according to the above described sixth invention, it is preferable for the phase difference between the first and second alternating current signals to be 90°.

In such a configuration, the fluctuation in the amplitude detection signal caused by a periodic change in the alternating current signals of the amplitude detecting circuit can theoretically be nullified, and thus, distortion in the output signal of the AGC circuit can be nullified.

In addition, in the AGC amplifier circuit according to the above described sixth invention, a first full wave rectifier for carrying out full wave rectifying on the first alternating current signal that is outputted from the phase shifter so as to input the resulting signal into the squaring and averaging circuit, and a second full wave rectifier for carrying out full wave rectifying on the second alternating current signal that is outputted from the phase shifter so as to input the resulting signal into the squaring and averaging circuit may be provided between the phase shifter and the squaring and averaging circuit.

As described above, the AGC amplifier circuit according to the present invention has the above described configuration where a signal gained by averaging a number of, for example, two, full wave rectified waveforms between which there are shifts in phase, is used as an amplitude detection signal. Therefore, the fluctuation that is in sync with the frequency of the transmission signal in this amplitude detection signal is reduced, and thus, the fluctuation in the gain of the AGC amplifier circuit can be reduced, and the amplitude of the output signal of the AGC amplifier circuit can be improved, so that distortion is reduced.

The output of an AGC amplifier circuit according to the prior art is distorted because the DC voltage of the output of the amplitude detection signal is not constant, but rather, swings a great deal. The present invention is gained by focusing on the properties where the period of this swing interlocks with the period of the output signal. When the phase of the output signal is delayed by n° before detection, the phase of the swing of the DC voltage of the output that is detected is also delayed by n°. Accordingly, a phase shifter and two full wave rectifiers are used so as to average two full wave rectified waveforms between which there is a shift in phases, and thereby, the swing of the amplitude detection signal can be reduced to a great extent or cancelled. As a result of this, the fluctuation in the gain of the AGC amplifier circuit is reduced, and therefore, the amplitude of the output signal of the AGC amplifier circuit can be improved, so that distortion is reduced.

Furthermore, in the conventional AGC amplifier circuit according to the prior art, a smoothing condenser is utilized, in order to average the amplitude detection signal, that is to say, the fluctuating voltage, and therefore, the time constant of the feedback circuit is increased, and thus, the speed of response for the AGC is sacrificed. That is to say, there is a relation of trading off, where the amplitude detection signal cannot be averaged, that is to say, the AGC circuit cannot be improved so that distortion is reduced, unless the time constant of the feedback circuit is increased. In the AGC amplifier circuit of the present invention, the amplitude detection signal, that is to say, fluctuating DC voltage, can be averaged, and thus, it becomes possible to improve the AGC circuit so that distortion is reduced. At the same time, a smoothing condenser is not used, and therefore, the time constant of the feedback circuit remains the same and the speed of response for the AGC is sufficiently fast.

Here, alternating current signals between which there are shifts in phases may be squared and averaged, and thereby, the same effects as those described above can be gained.

DESCRIPTION OF THE PREFERRED EMBODIMENTS

Embodiment 1

In the following, Embodiment 1 of the present invention is described in reference to the drawings.

Figure 1:
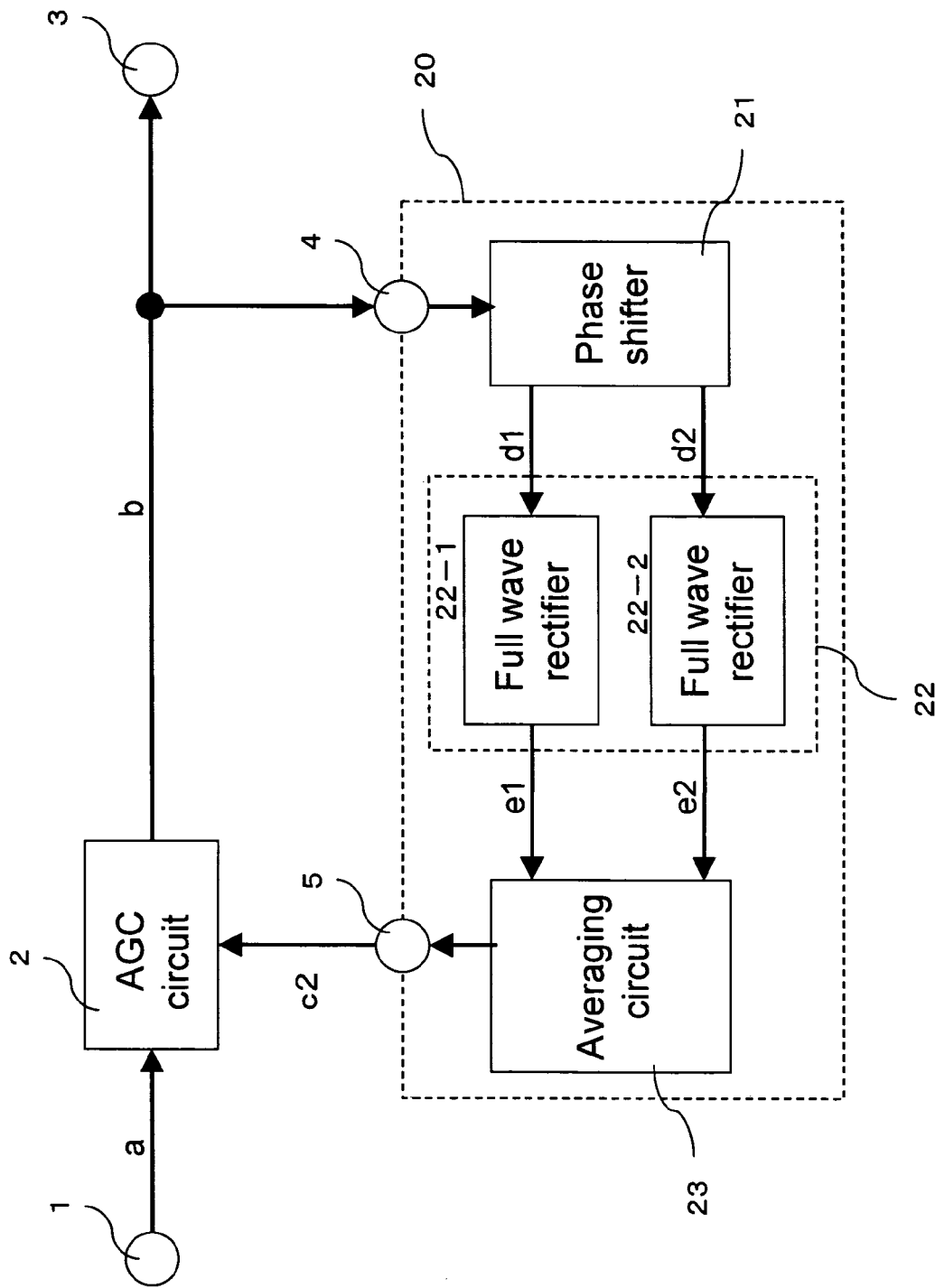
FIG. 1 is a block diagram showing the configuration of an AGC amplifier circuit according to Embodiment 1 of the present invention.

FIG. 1 is a block diagram showing an AGC amplifier circuit according to Embodiment 1 of the present invention. The AGC amplifier circuit of this embodiment 1 is, as shown in FIG. 1, formed of an input terminal 1, an AGC circuit 2, an output terminal 3, an amplitude detecting circuit input terminal 4, an amplitude detecting circuit 20 and an amplitude detecting circuit output terminal 5.

AGC circuit 2 amplifies transmission signal a that has been inputted into input terminal 1 by the gain in accordance with a gain control signal so as to output the resulting signal, and thereby, makes the amplitude of output signal b constant, irrespectively of the fluctuation in the amplitude of transmission signal a.

Output signal b of AGC circuit 2 is inputted into amplitude detecting circuit input terminal 4. Amplitude detecting circuit 20 detects the amplitude of output signal b of AGC circuit 2, and outputs amplitude detection signal c2 to amplitude detecting circuit output terminal 5. Then, the outputted signal is fed back to AGC circuit 2 as a gain control signal, so as to determine the gain of AGC circuit 2. In this manner, AGC circuit 2 and amplitude detecting circuit 20 form a feedback loop.

Next, the internal configuration of amplitude detecting circuit 20 is described. As shown in FIG. 1, amplitude detecting circuit 20 is formed of amplitude detecting circuit input terminal 4, a phase shifter 21, a full wave rectifier block 22, an averaging circuit 23 and amplitude detecting circuit output terminal 5. Full wave rectifier block 22 is formed of two full wave rectifiers 22-1 and 22-2.

Phase shifter 21 into which output signal b of AGC circuit 2 is inputted through amplitude detecting circuit input terminal 4 outputs two signals d1 and d2 between which there is a phase difference. Full wave rectifiers 22-1 and 22-2 respectively carry out full wave rectifying on output signals d1 and d2 of phase shifter 21. Averaging circuit 23 adds up output signals e1 and e2 of full wave rectifiers 22-1 and 22-2, thereby averaging them, so as to output the resulting signal to amplitude detecting circuit output terminal 5 as amplitude detection signal c2.

Figure 2:
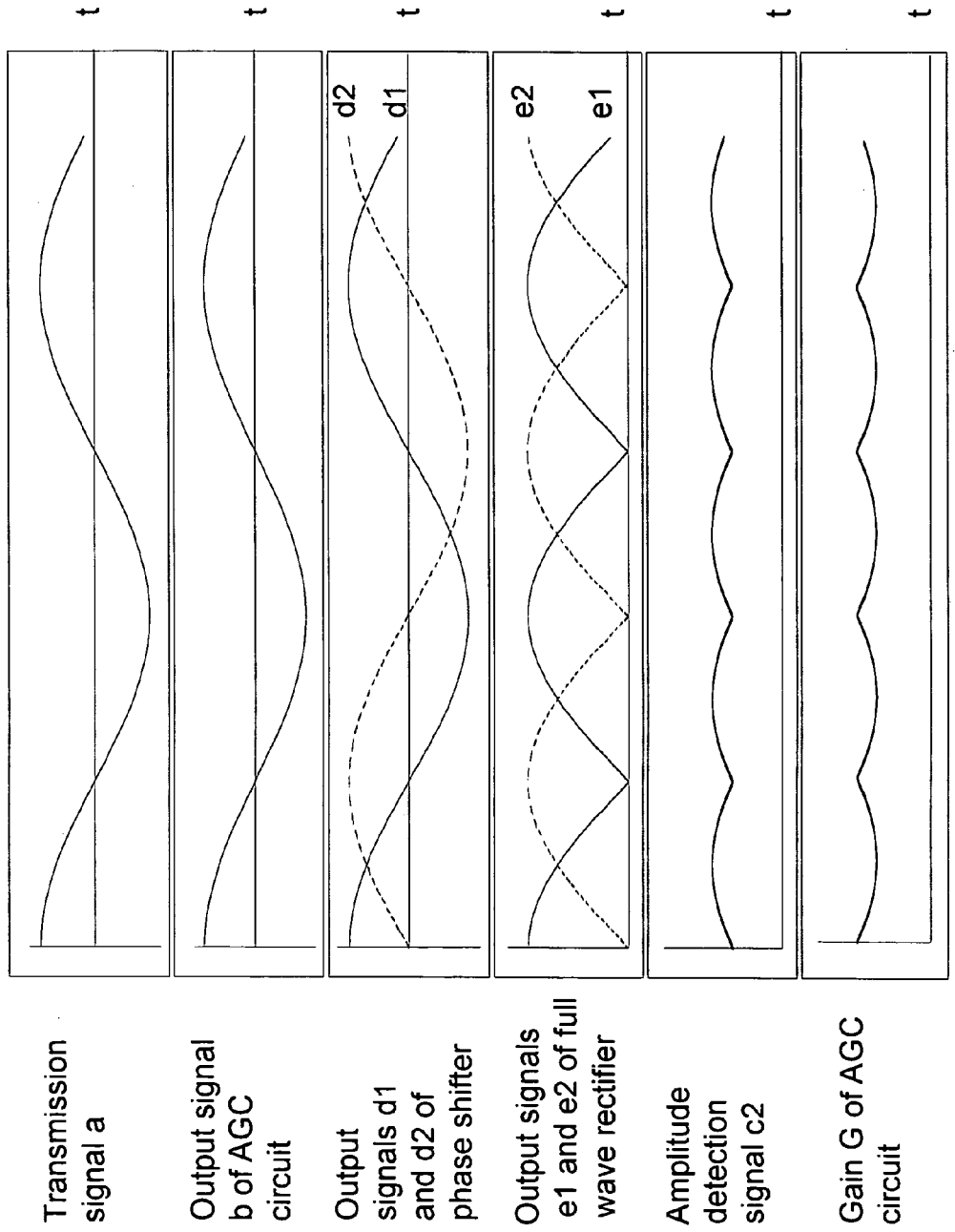
FIG. 2 is a time chart for illustrating the operation of the AGC amplifier circuit of FIG. 1.
Figure 3:
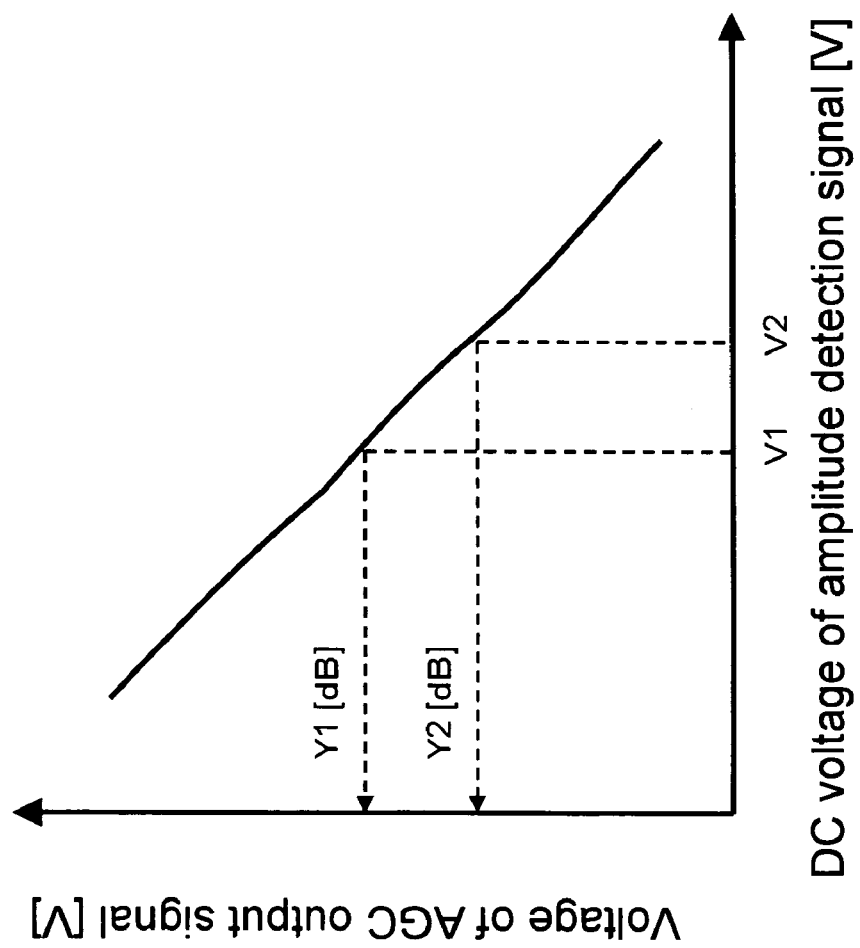
FIG. 3 is a graph showing an example of the properties the DC voltage of the amplitude detection signal against the voltage of the AGC output signal.

Next, the operation of the AGC amplifier circuit according to the present embodiment is described in detail in reference to FIGS. 1, 2 and 3. The gain control properties of AGC circuit 2 are control properties, as shown in FIG. 3. In FIG. 3, when the DC voltage of the amplitude detection signal has values V1 and V2, the gain of AGC circuit 2 has values Y1 [dB] and Y2 [dB], respectively. In this manner, the gain of AGC circuit 2 is uniquely determined in accordance with the DC voltage of the amplitude detection signal.

FIG. 2 shows the operation waveforms of the output signals of the respective circuit blocks in the AGC amplifier circuit. FIG. 2 shows the waveform of transmission signal a, the waveform of output signal b of AGC circuit 2, the waveforms of two outputs signals d1 and d2 of phase shifter 21, the waveforms of output signals e1 and e2 of full wave rectifiers 21-1 and 22-2, the waveform of amplitude detection signal c2 and the change in gain G of the AGC circuit, respectively.

In this AGC amplifier circuit, transmission signal a (for example, sine waveform) of FIG. 2 that has been inputted into input terminal 1 is inputted into AGC circuit 2. As shown in FIG. 2, AGC circuit 2 outputs output signal b that has been gained by amplifying transmission signal a by, for example, Y1 [dB]. This output signal b branches into two, in such a manner that one is directed to output terminal 3 and the other is inputted into amplitude detecting circuit input terminal 4.

Output signal b of AGC circuit 2 that has been inputted into this amplitude detecting circuit input terminal 4 is inputted into phase shifter 21. As shown in FIG. 2, phase shifter 21 outputs two signals d1 and d2 between which there is a phase difference. The two signals d1 and d2 are respectively inputted into full wave rectifiers 22-1 and 22-2. Phase difference φ between signals d1 and d2 may be in a range of $45° < \phi < 135°$, FIG. 2 shows a case of 90° exhibiting the best effects according to the present embodiment. In this example, signal d1 has the same phase as output signal b, and the phase of signal d2 is delayed by 90° relative to that of output signal b.

As shown in FIG. 2, signals e1 and e2, on which full wave rectifying has been respectively carried out, are outputted from full wave rectifiers 22-1 and 22-2 so as to be inputted into averaging circuit 23.

Averaging circuit 23 adds up output signals e1 and e2 of full wave rectifiers 22-1 and 22-2, and thereby, averages them, and as shown in FIG. 2, outputs the resulting signal to amplitude detecting circuit output terminal 5 as amplitude detection signal c2. This amplitude detection signal c2 is inputted into AGC circuit 2 as a gain control signal, and as shown in FIG. 2, gain G of AGC circuit 2 is determined from the control properties of FIG. 3. In this manner, a feedback loop is formed, of AGC circuit 2 and amplitude detecting circuit 20.

The respective circuits that form this feedback loop operate at a speed that is sufficiently faster (for example, 10 or more times faster) than that of transmission signal a. That is to say, the time constant of the feedback loop is small, and thus, the responsiveness of the AGC circuit is excellent.

As described above, according to the present embodiment, two signals d1 and d2 between which there is a shift in phase are produced in amplitude detecting circuit 20, and full wave rectifying is respectively carried out on them so as to average them, and thereby, amplitude detection signal c2 is generated.

Figure 8:
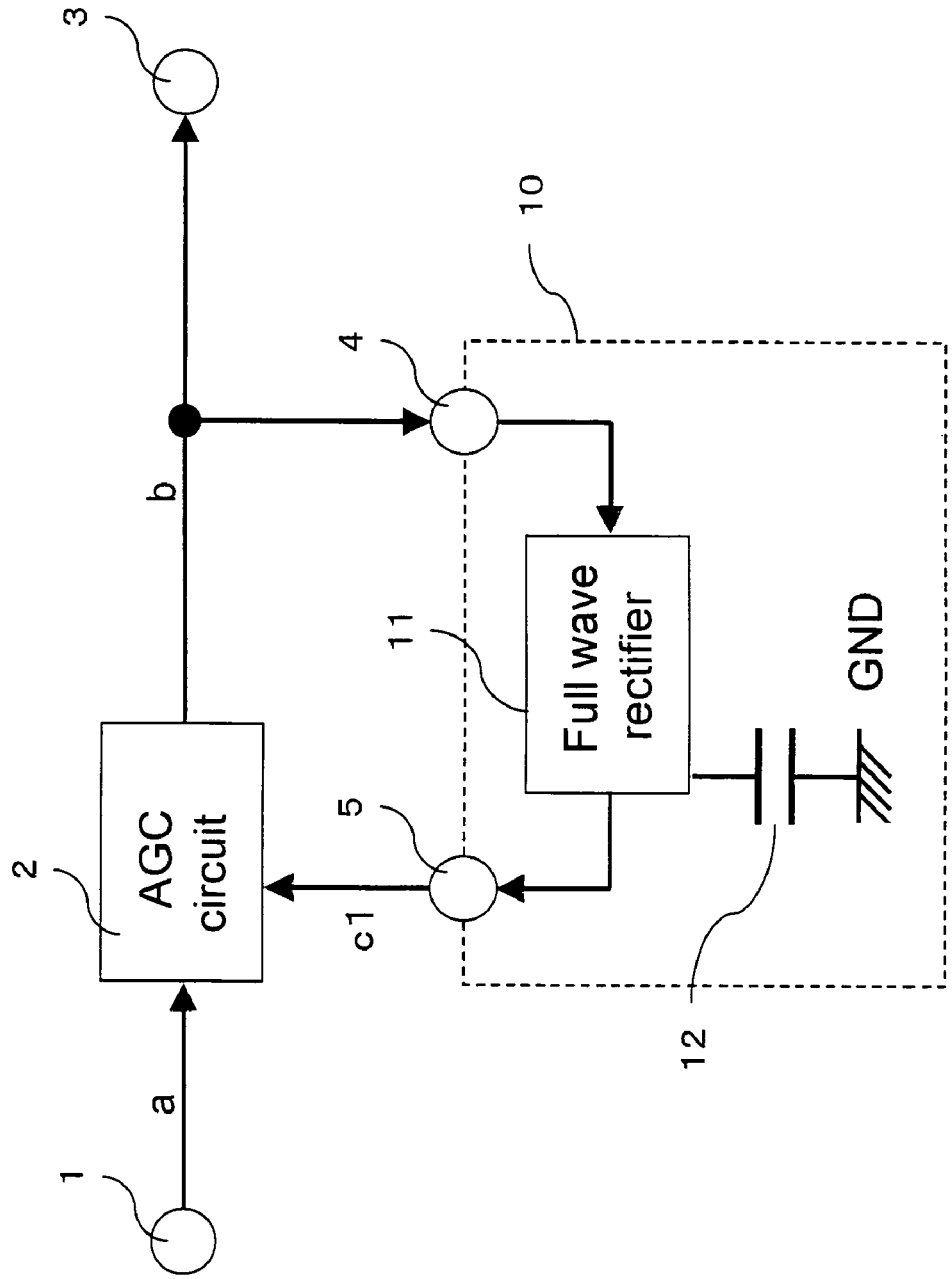
FIG. 8 is a block diagram showing the configuration of an AGC amplifier circuit according to the prior art.
Figure 9:
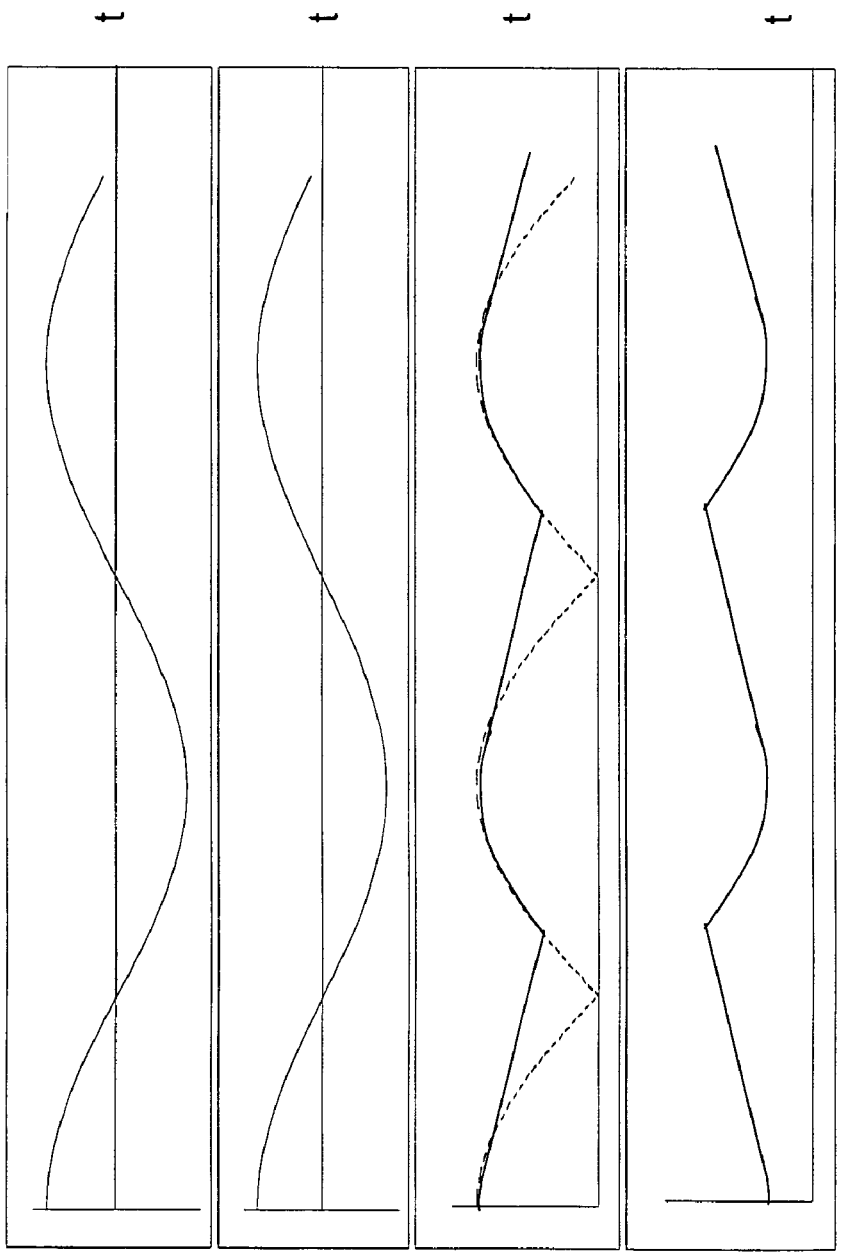
FIG. 9 is a time chart for illustrating the operation of the AGC amplifier circuit of FIG. 8.

In an AGC amplifier circuit according to the prior art as shown in FIG. 8, amplitude detection signal c1 fluctuates a great deal, causing distortion in the output waveform of AGC circuit 2. Here, attention is focused on the property where the period of the fluctuation of amplitude detection signal c1 interlocks with the period of output signal b of AGC circuit 2, and thereby, it has been found that the phase of the fluctuation in the DC voltage that is the detected output is delayed by n° when the amplitude is detected by delaying the phase of output signal b by n°. Therefore, a configuration where two waveforms on which full wave rectifying has been carried out and between which there is a shift in phase are averaged by using phase shifter 21, two full wave rectifiers 22-1 and 22-2, and averaging circuit 23 is adopted according to Embodiment 1 of the present invention. Consequently, the fluctuation in amplitude detection signal c1 can be reduced a great deal. As a result of this, the fluctuation in the gain of AGC circuit 2 is reduced, and thus, distortion in the amplitude of output signal b of AGC circuit 2 can be improved.

In order to reduce the fluctuation in the DC voltage of amplitude detection signal c1, the fluctuation in amplitude detection signal c1 is reduced using smoothing condenser 12, and thereby, distortion in output signal b of AGC circuit 2 is reduced in the AGC amplifier circuit that uses amplitude detecting circuit 10 according to the prior art, as shown in FIG. 8. However, the time constant of the feedback circuit becomes greater, and the speed of response of the AGC is sacrificed.

In contrast to this, according to the present embodiment, the fluctuation in amplitude detection signal c2 that causes distortion in output signal b of AGC circuit 2 can be reduced. The effects of reduction are not smaller than those of the conventional AGC amplifier circuit, and operation where the response of the AGC is sufficiently fast is made possible, because of the lack of an increasing factor in the time constant of the feedback circuit.

Embodiment 2

Figure 4:
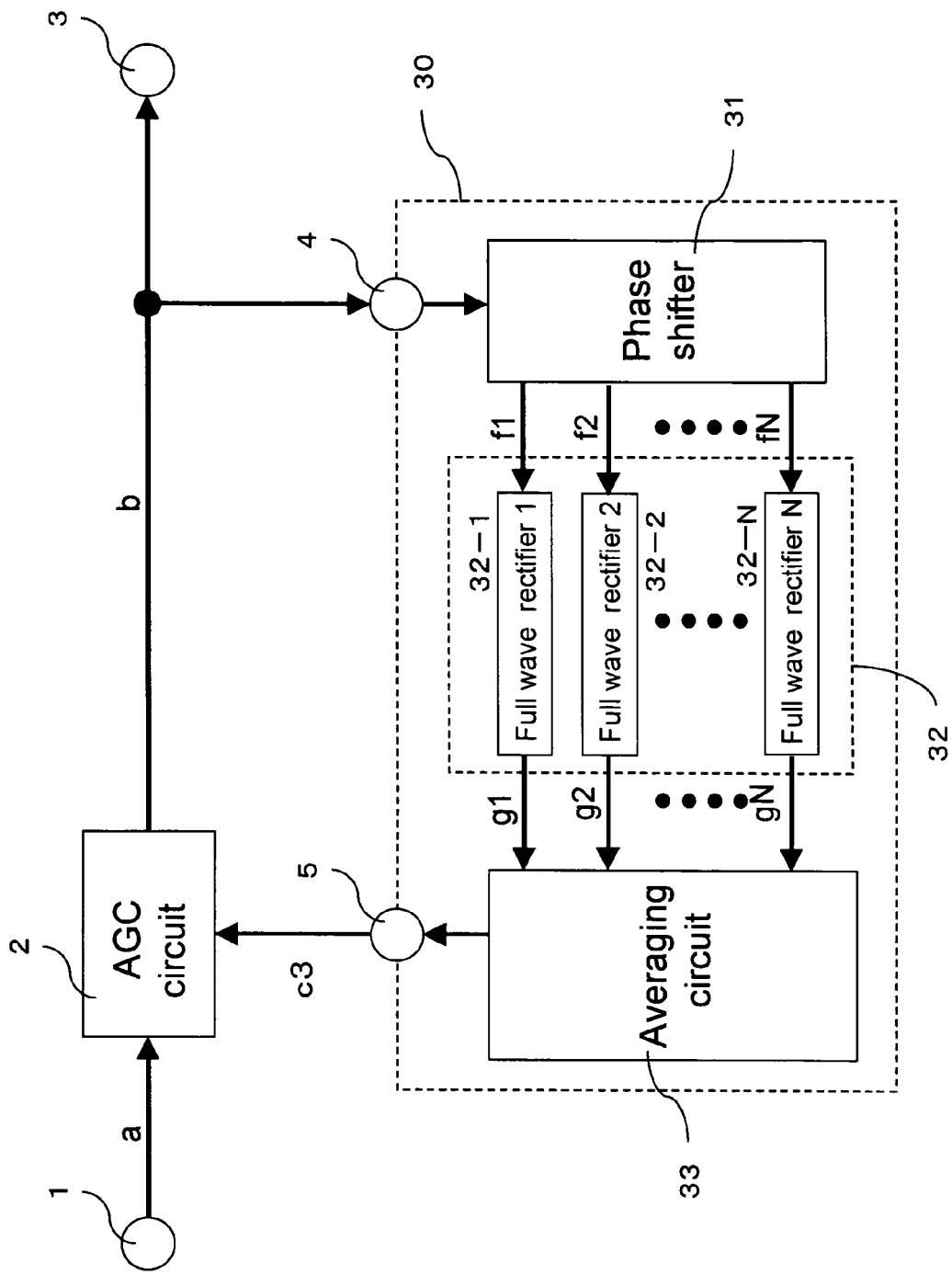
FIG. 4 is a block diagram showing the configuration of an AGC amplifier circuit according to Embodiment 2 of the present invention.
Figure 5:
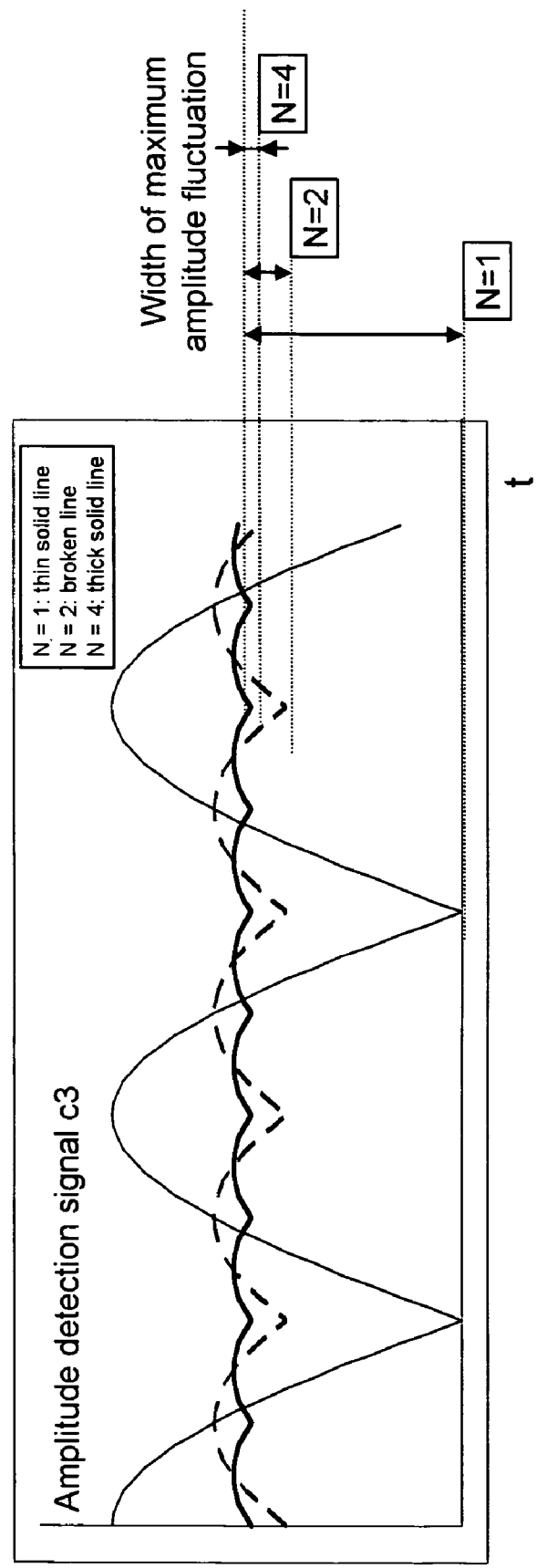
FIG. 5 is a time chart for illustrating the operation of the AGC amplifier circuit of FIG. 4.

Embodiment 2 of the present invention is described in reference to FIGS. 4 and 5. This embodiment 2 is provided in order to further improve the effects of reducing distortion in an AGC amplifier circuit according to the present invention. This AGC amplifier circuit according to Embodiment 2 is formed, as shown in FIG. 4, of an input terminal 1, an AGC circuit 2, an output terminal 3, an amplitude detecting circuit input terminal 4, an amplitude detecting circuit 30, and an amplitude detecting circuit output terminal 5.

AGC circuit 2 is the same as that of Embodiment 1.

Output signal b of AGC circuit 2 is inputted into amplitude detecting circuit input terminal 4. Amplitude detecting circuit 30 detects the amplitude of output signal b of AGC circuit 2, and outputs amplitude detection signal c3 to amplitude detecting circuit output terminal 5. Then, amplitude detection signal c3 is fed back into AGC circuit 2 as a gain control signal, and thus, determines the gain of AGC circuit 2. In this manner, AGC circuit 2 and amplitude detecting circuit 30 form a feedback loop.

Next, the internal configuration of amplitude detecting circuit 30 is descried. As shown in FIG. 4, amplitude detecting circuit 30 is formed of amplitude detecting circuit input terminal 4, a phase shifter 31, a full wave rectifier block 32, an averaging circuit 33 and amplitude detecting circuit output terminal 5. This embodiment differs from Embodiment 1 in the configuration of amplitude detecting circuit 30.

In this amplitude detecting circuit 30, phase shifter 31 has N outputs f1 to fN, between which there are phase differences. In addition, full wave rectifier block 32 is formed of N (N is an integer of no less than 3) full wave rectifiers 32-1 to 32-N, so as to respectively carry out full wave rectifying on N outputs f1 to fN of phase shifter 31. Then, averaging circuit 33 adds up output signals g1 to gN of N full wave rectifiers 32-1 to 32-N, and thereby, averages them.

There are N outputs f1, f2, . . . , fN, of phase shifter 31, and these respectively have sequential phases, as follows:

$$\theta k = \pi \cdot k/N [\text{rad}] (k=0, 1, 2, \ldots, N-1)$$

N outputs f1, f2, . . . , fN of phase shifter 31 are respectively inputted into full wave rectifiers 32-1 to 32-N and detected in the respective full wave rectifiers 32-1 to 32-N, so as to be converted to N outputs g1, g2, . . . , gN, respectively, which are then respectively inputted into averaging circuit 33. Consequently, averaging circuit 33 averages N outputs g1, g2, . . . , gN and outputs the resulting signal to amplitude detecting circuit output terminal 5 as amplitude detection signal c3.

The degree of reduction in distortion in the AGC circuit according to this embodiment 2 is checked as follows. The width of the maximum amplitude fluctuation of amplitude detection signal c3 is used as an index, in a manner where the width of the maximum amplitude fluctuation of the amplitude detection signal in the case of N=1 (thin solid line) is set as a reference (100%), and the width of the maximum amplitude fluctuation of amplitude detection signal c3 is compared in the case of N=2 (broken line) and in the case of N=4 (thick solid line) Here, the width of the maximum amplitude fluctuation is defined as follows:

Max. (Abs. ("amplitude detection signal C3"−"average value of amplitude detection signal C3"))

where symbol Max. means the maximum value and symbol Abs. means the absolute value.

The case of N=2 corresponds to Embodiment 1. FIG. 5 shows the waveform of amplitude detection signal c3. When N=1, the width of the maximum amplitude fluctuation relative to the average output value of amplitude detection signal c3 is 100%, while it becomes approximately 21% when N=2 and approximately 5% when N=4. It can be seen that the smaller this percentage is, the smaller the width of the maximum amplitude fluctuation of amplitude detection signal c3 is. That is to say, it can be seen that the greater value N is, the more distortion in AGC circuit 2 is reduced.

Embodiment 3

Figure 6:
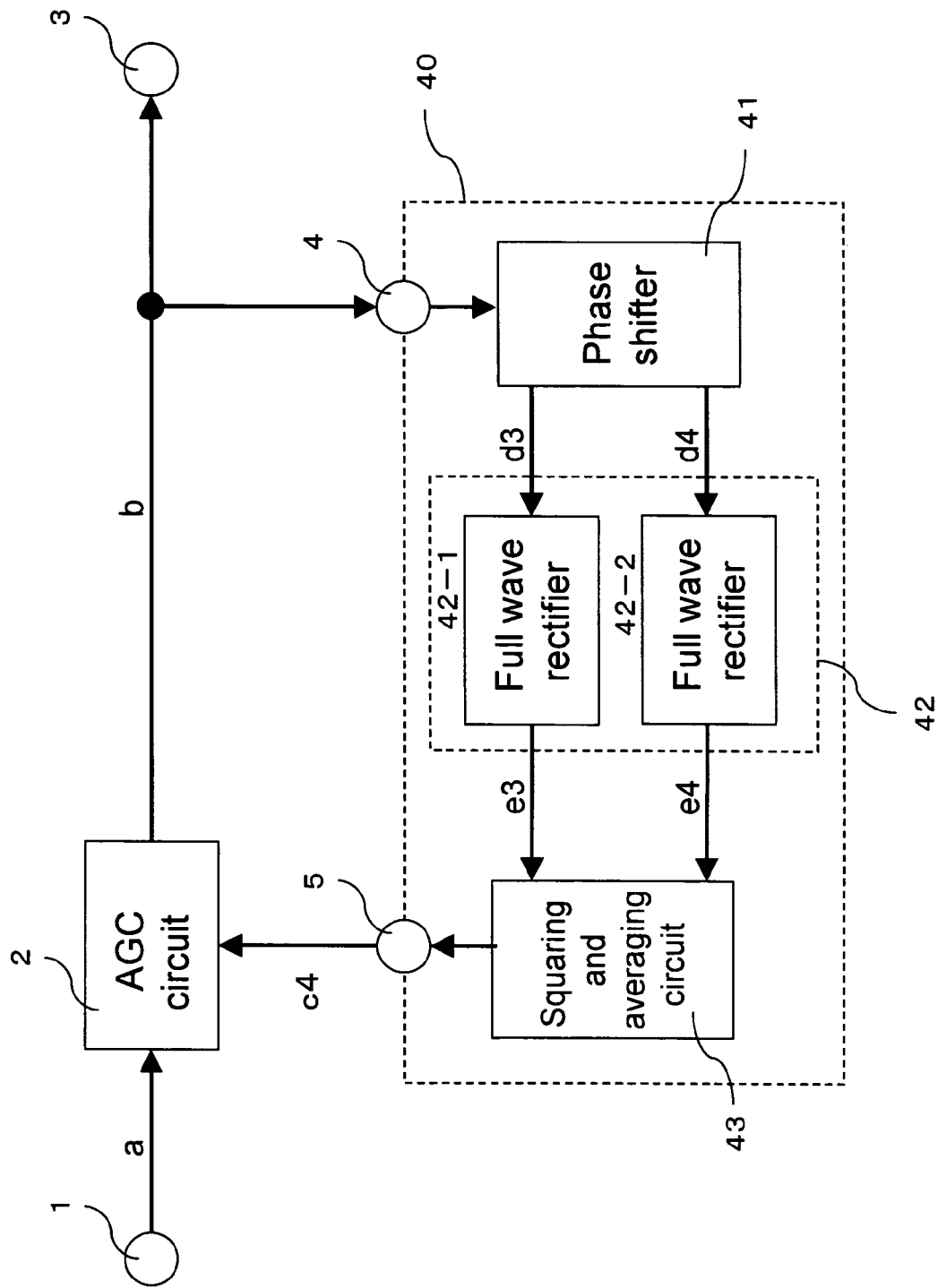
FIG. 6 is a block diagram showing the configuration of an AGC amplifier circuit according to Embodiment 3 of the present invention.
Figure 7:
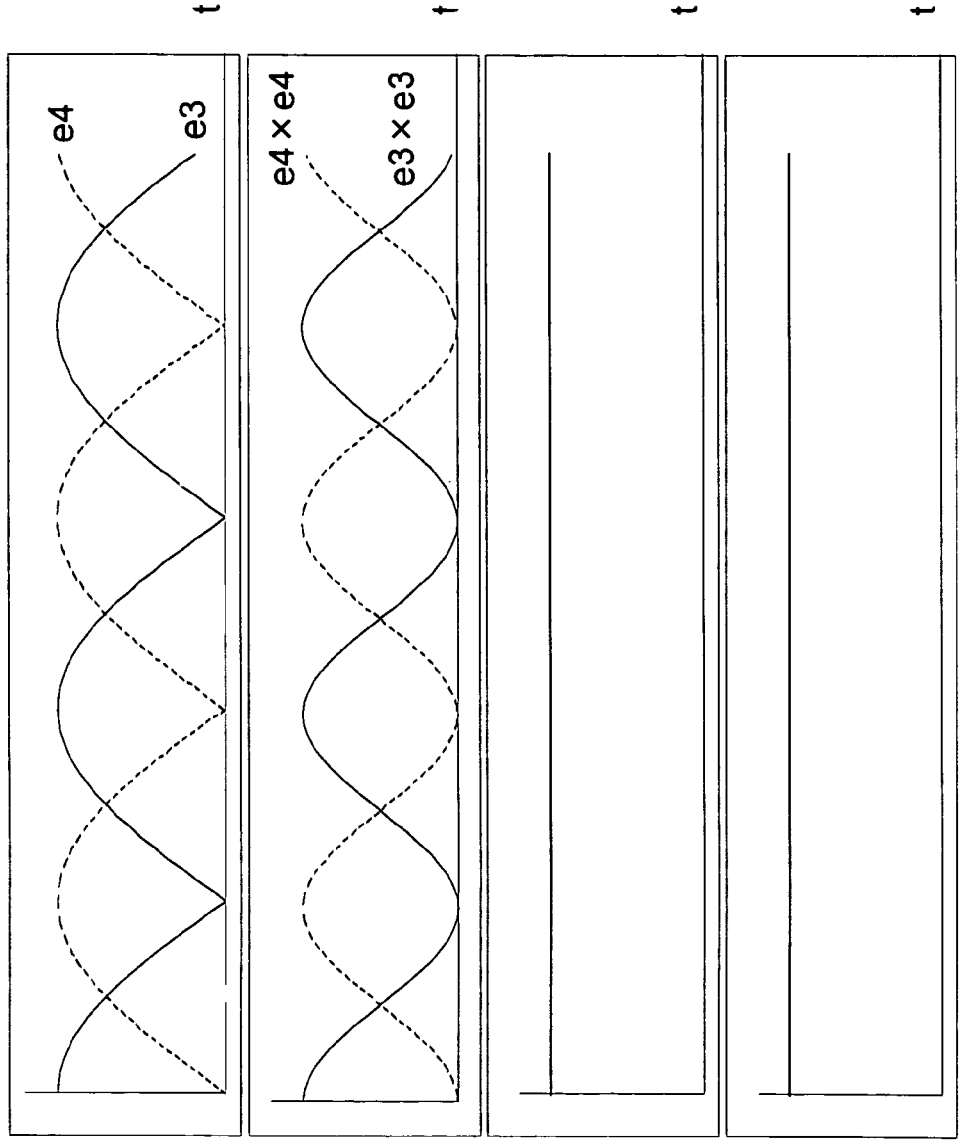
FIG. 7 is a time chart for illustrating the operation of the AGC amplifier circuit of FIG. 6.

Embodiment 3 of the present invention is described in reference to FIGS. 6 and 7. According to this Embodiment 3, distortion in the AGC circuit theoretically becomes 0 as a result of reduction in the distortion in the AGC circuit, which is the effect of the present invention. An AGC amplifier circuit according to this Embodiment 3 is formed, as shown in FIG. 6, of an input terminal 1, an AGC circuit 2, an output terminal 3, an amplitude detecting circuit input terminal 4, an amplitude detecting circuit 40 and an amplitude detecting circuit output terminal 5.

AGC circuit 2 is the same as that of Embodiment 1.

Output signal b of AGC circuit 2 is inputted into amplitude detecting circuit input terminal 4. Amplitude detecting circuit 40 detects the amplitude of output signal v of AGC circuit 2, and outputs amplitude detection signal c4 from amplitude detecting circuit output terminal 5. Then, amplitude detection signal c4 is fed back to AGC circuit 2 as a gain control signal and determines the gain of AGC circuit 2. In this manner, AGC circuit 2 and amplitude detecting circuit 40 form a feedback loop.

Next, the internal configuration of amplitude detection signal 40 is described. As shown in FIG. 6, amplitude detection circuit 40 is formed of amplitude detecting circuit input terminal 4, a phase shifter 41, a full wave rectifier block 42, a squaring and averaging circuit 43 and amplitude detecting circuit output terminal 5. This embodiment differs from Embodiment 1 in the configuration of this amplitude detecting circuit 40.

In this amplitude detecting circuit 40, phase shifter 31 has two outputs d3 and d4 between which there is a phase difference. In addition, full wave rectifier block 42 is formed of two full wave rectifiers 42-1 and 42-2, which respectively carry out full wave rectifying on the two outputs d3 and d4 of phase shifter 41. In addition, squaring and averaging circuit 33 squares and averages output signals e3 and e4 of the two full wave rectifiers 42-1 and 42-2.

There is a phase difference of 90° between the two outputs d3 and d4 of phase shifter 41. Outputs d3 and d4 are respectively represented in the following expressions:

$$d3 = A \cos(\omega t)$$

$$d4 = A \sin(\omega t)$$

(where A is a constant representing the amplitude and ω is an angular frequency)

The two outputs of phase shifter 41 are respectively inputted into full wave rectifiers 42-1 and 42-2 and respectively rectified in full wave rectifiers 42-1 and 42-2, so as to be converted to two outputs e3 and e4, respectively. FIG. 7 shows the waveforms of output signals e3 and e4 of full wave rectifiers 42-1 and 42-2. Output signals e3 and e4 are respectively represented by the following equations:

$$e3 = A\cos(\omega t) ((4n-1)\pi/2 \leq t < (4n+1)\pi/2)$$

$$e3 = -A\cos(\omega t) ((4n+1)\pi/2 \leq t < (4n+3)\pi/2)$$

$$e4 = A\sin(\omega t)(2n\pi \leq t < (2n+1)\pi)$$

$$e4 = -A\sin(\omega t)((2n+1)\pi \leq t < 2(n+1)\pi)$$

Signals e3 and e4 are inputted into squaring and averaging circuit 43. In the squaring and averaging circuit, signals e3 and e4 are respectively squared, and after that, added up, and then, amplitude detection signal c4, which is the result of the addition, is outputted to amplitude detecting circuit output terminal 15 as a gain control signal.

FIG. 7 shows the waveforms of signals e3×e3 and e4×e4, the waveforms of amplitude detection signal c4 and the change in gain G of AGC circuit 2, respectively, in addition to the waveforms of output signals e3 and e4 of full wave rectifiers 42-1 and 42-2. Signals e3×e3, e4×e4 and c4 are respectively represented by the following equations:

$$e3 \times e3 = A^2 \{1 + \cos(2\omega t)\}/2$$

$$e4 \times e4 = A^2 \{1 - \cos(2\omega t)\}/2$$

$$c4 = (e3 \times e3) + (e4 \times e4) = A^2$$

These operation results show that amplitude detection signal c4 does not have any fluctuation, and has a value that is equal to that of the squared amplitude of output signal b of AGC circuit 2. That is to say, according to this Embodiment 3, the DC voltage of amplitude detection signal c4 does not fluctuate, and therefore, as shown in FIG. 7, gain G of AGC circuit 2 also does not fluctuate. Thus, AGC circuit 2 has a circuit configuration where a transmission signal that is not distorted is outputted.

Here, in the case where full wave rectifier 42 that forms amplitude detecting circuit 40 of Embodiment 3 is omitted in a manner where first output signal d3 of phase shifter 41 and second output signal d4 of phase shifter 41 are inputted directly into squaring and averaging circuit 43, the output of amplitude detecting circuit 40 becomes the same as the above described amplitude detection signal c4.

In addition, in the above described Embodiment 3, a case where the phase difference between the two outputs d3 and d4 of phase shifter 41 is 90° is described. In the case of actual use, however, amplitude detection signal C4 has a small amount of fluctuation and may be considered approximately constant, even when the phase difference deviates from 90° by, for example, approximately +/−1°.

INDUSTRIAL APPLICABILITY

An amplitude detecting circuit and an AGC amplifier circuit according to the present invention are useful in a circuit block that forms a system where it is important to check distortion properties.

The invention claimed is:

1. An amplitude detecting method for gaining an amplitude detection signal by generating a number of alternating current signals between which there are phase differences on the basis of an alternating current signal of an object of amplitude detection and by carrying out same waveform processes on said number of alternating signals so as to average said number of alternating signals,
   wherein said waveform processes include a full wave rectifying process.

2. The amplitude detecting method according to claim 1, wherein said waveform processes include a squaring process.

3. An AGC circuit gain control method for supplying an amplitude detection signal to an AGC circuit as a gain control signal, by generating a number of alternating current signals between which there are phase differences on the basis of an alternating current signal that is outputted from said AGC circuit, by carrying out same waveform processes on said number of alternating current signals so as to average said number of alternating current signals and thereby gaining said amplitude detection signal,
   wherein said waveform processes include a full wave rectifying process.

4. The AGC circuit gain control method according to claim 3, wherein said waveform processes include a squaring process.

5. An amplitude detecting circuit, comprising:
   a phase shifter into which an alternating current signal of an object of amplitude detection is inputted and which outputs a number of alternating current signals between which there are phase differences;
   a number of full wave rectifiers which respectively carry out full wave rectifying on said number of alternating current signals that are outputted from said phase shifter; and
   an averaging circuit for generating an amplitude detection signal by averaging output signals of said number of full wave rectifiers.

6. The amplitude detecting circuit according to claim 5, wherein said number of alternating current signals comprise first and second alternating current signals and the phase difference φ between said first and second alternating current signals has a value in a range of 45°<φ<135°.

7. An amplitude detecting circuit, comprising:
   a phase shifter into which an alternating current signal of an object of amplitude detection is inputted and which outputs first and second alternating current signals between which there is a phase difference;
   a squaring and averaging circuit for generating an amplitude detection signal by squaring and averaging said first and second alternating current signals that are outputted from said phase shifter; and
   a first full wave rectifier for carrying out full wave rectifying on said first alternating current signal that is outputted from said phase shifter so as to input the resulting signal into said squaring and averaging circuit and a second full wave rectifier for carrying out full wave rectifying on said second alternating current signal that is outputted from said phase shifter so as to input the resulting signal into said squaring and averaging circuit, wherein said first full wave rectifier and said second full wave rectifier are provided between said phase shifter and said squaring and averaging circuit.

8. The amplitude detecting circuit according to claim 7, wherein there is a phase difference of 90° between said first and second alternating current signals.

9. An AGC amplifier circuit, comprising:
   an AGC circuit into which an alternating current input signal is inputted and which amplifies the inputted signal by the gain that is in accordance with a gain control signal so as to output an alternating current signal; and
   an amplitude detecting circuit for generating an amplitude detection signal which corresponds to the amplitude of the alternating current signal that is outputted from said AGC circuit so as to supply the amplitude detection signal to said AGC circuit as said gain control signal, wherein said amplitude detecting circuit comprises: a phase shifter into which an alternating current signal that is outputted from said AGC circuit is inputted and which outputs a number of alternating current signals between which there are phase differences; a number of full wave rectifiers which respectively carry out full wave rectifying on said number of alternating current signals that are outputted from said phase shifter; and an averaging circuit for averaging output signals of said number of full wave rectifiers so as to generate said amplitude detection signal.

10. The AGC amplifier circuit according to claim 9, wherein said number of alternating current signals comprise first and second alternating current signals and the phase difference $\phi$ between said first and second alternating current signals has a value in a range of $45° < \phi < 135°$.

11. An AGC amplifier circuit, comprising:

an AGC circuit into which an alternating current input signal is inputted and which amplifies the inputted signal by the gain in accordance with a gain control signal so as to output an alternating current signal; and an amplitude detecting circuit for generating an amplitude detection signal which corresponds to the amplitude of the alternating current signal that is outputted from said AGC circuit so as to supply the amplitude detection signal to said AGC circuit as said gain control signal, wherein said amplitude detecting circuit comprises: a phase shifter into which an alternating current signal that is outputted from said AGC circuit is inputted and which outputs first and second alternating current signals between which there is a phase difference; and a squaring and averaging circuit for generating said amplitude detection signal by squaring and averaging said first and second alternating current signals that are outputted from said phase shifter.

12. The AGC amplifier circuit according to claim 11, wherein there is a phase difference of 90° between said first and second alternating current signals.

13. The AGC amplifier circuit according to the claim 11, further comprising a first full wave rectifier for carrying out full wave rectifying on said first alternating current signal that is outputted from said phase shifter so as to input the resulting signal into said squaring and averaging circuit and a second full wave rectifier for carrying out full wave rectifying on said second alternating current signal that is outputted from said phase shifter so as to input the resulting signal into said squaring and averaging circuit, wherein said first full wave rectifier and said second full wave rectifier between said phase shifter and said squaring and averaging circuit.

* * * * *